United States Patent [19]
Yoshida

[11] 4,205,273
[45] May 27, 1980

[54] PULSE SIGNAL AMPLIFIER

[75] Inventor: Tadao Yoshida, Tokyo, Japan

[73] Assignee: Sony Corporation, Tokyo, Japan

[21] Appl. No.: 6,763

[22] Filed: Jan. 26, 1979

[30] Foreign Application Priority Data

Jan. 30, 1978 [JP] Japan .................................. 53-9138

[51] Int. Cl.² ........................... H03F 3/18; H03F 3/30
[52] U.S. Cl. ..................................... 330/251; 307/255;
330/267
[58] Field of Search ................ 330/10, 207 A, 207 P,
330/251, 267, 298; 307/255, 300

[56] References Cited
U.S. PATENT DOCUMENTS 4,021,748   5/1977   Yoshida et al. ............. 330/207 A X Primary Examiner—James B. Mullins
Attorney, Agent, or Firm—Hill, Van Santen, Steadman, Chiara & Simpson

[57] ABSTRACT

A pulse signal amplifier includes a pair of complementary drive transistors and a pair of complementary output transistors, each being connected in an emitter-follower circuit to supply an amplified pulse signal to an inductive load. A leakage current from said inductive load is prevented from flowing to the base-emitter circuit of the output transistor by a current limiting circuit.

10 Claims, 6 Drawing Figures

PULSE SIGNAL AMPLIFIER

BACKGROUND OF THE INVENTION

1. Field of the Invention

The present invention relates generally to a pulse signal amplifier, and is directed more particularly to a pulse signal amplifier in which the leakage current from an inductive load is prevented from flowing to the base-emitter circuit of an output transistor.

2. Description of the Prior Art

In the art there has been known, as a pulse signal amplifier which amplifies a pulse width modulated signal, the U.S. Pat. No. 4,021,748 entitled in "Amplifier with Field Effect Transistors Having Triode-type Dynamic Characteristics," assigned to the SONY CORPORATION and issued on May 3, 1977, in which an FET (field effect transistor) is used. According to the U.S. Patent, the switching frequency can be made high such as several hundreds $KH_z$ but it is rather expensive.

To avoid this defect, it may be considered that a bi-polar transistor, which is relatively low at cost and connected in an emitter-follower configuration, is used as a switching element. In this case, however, since its drive circuit becomes complicated and the bypass current from an inductive load is leaked through the base-emitter circuit of an output transistor, power loss can not be reduced even through the amplifier is a switching mode amplifier.

OBJECT AND SUMMARY OF THE INVENTION

Accordingly, it is an object of the present invention to provide a pulse signal amplifier free from the defects encountered in the prior art.

It is another object of the invention to provide a pulse signal amplifier, in which a bypass current flowing to a diode connected in parallel to an output transistor is prevented from being leaked through the base-emitter circuit of the output transistor.

In accordance with an example of the present invention, a pulse signal amplifier is provided which includes a DC voltage source circuit having a pair of first and second terminals, a pulse signal source circuit for supplying a pulse signal to be amplified, a pre-drive circuit including a pair of complementary first and second drive transistors, each having control, first and second output electrodes, the control electrodes of which are supplied with the pulse signal from the pulse signal source circuit, the first output electrodes of which are connected to each other and to a reference point, and the second output electrodes of which are connected to the first and second terminals of the DC voltage source circuit through first and second loads, respectively, a drive circuit including a pair of complementary third and fourth drive transistors, each having control, first and second output electrodes, the control electrodes of which are connected to the second output electrodes of the first and second drive transistors and the first output electrodes of which are connected to the first and second terminals of the DC voltage source circuit, respectively, an output stage circuit including a pair of complementary first and second transistors, each having base, emitter and collector electrodes, the base electrodes of which are connected to the second output electrodes of the third and fourth drive transistors, respectively, and collector and emitter circuits of which are connected in series between the first and second terminals of the DC voltage source circuit, and the connection point of which is connected to an output terminal to which an inductive load is connected, first and second diode circuits connected between the collector and emitter electrodes of the first and second output transistors, respectively, through the first diode circuit of which flows a first bypass current from the inductive load during the first quarter-period of the pulse signal from the pulse signal source circuit and through the second diode circuit of which flows a second bypass current from the inductive load during the third quarter-period of the pulse signal source circuit, and a current limiting circuit connected between the second output electrodes of the third and fourth drive transistors such that the first and second bypass currents are prevented from flowing through the base-emitter circuit of the second and first output transistors, respectively, into the second output electrodes of the third and fourth drive transistors.

The other objects, features and advantages of the present invention will become apparent from the following description taken in conjunction with the accompanying drawings through which the like reference numerals and letters designate the same elements and so on.

DESCRIPTION OF THE PREFERRED EMBODIMENTS

In order to better understand the present invention, at first prior art pulse signal amplifiers for a pulse width modulated signal will be described with reference to FIGS. 1 and 2.

Figure 1:
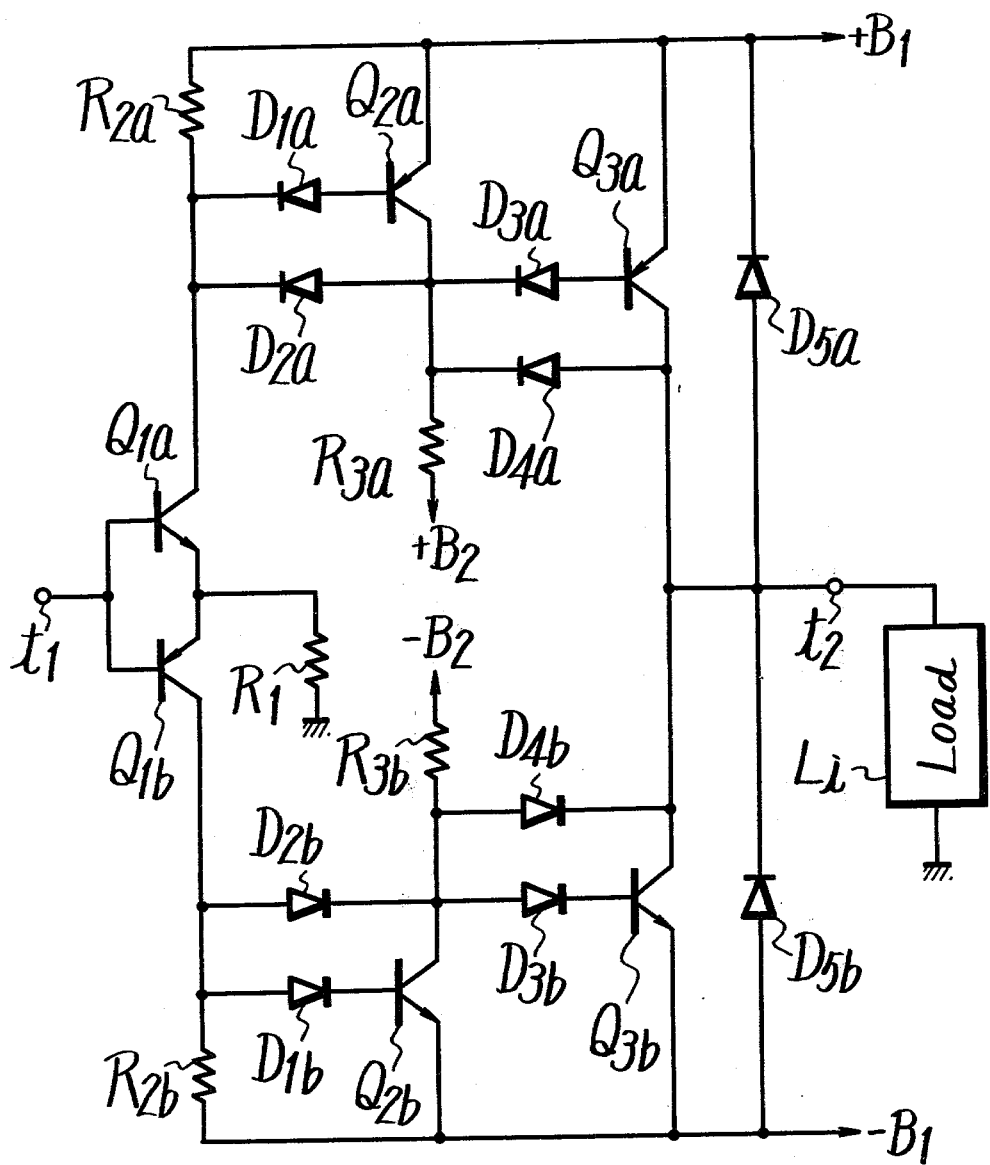
FIGS. 1 and 2 are circuit diagram showing examples of the prior art pulse signal amplifier, respectively.

In the prior art pulse signal amplifier shown in FIG. 1, the collector electrodes of a pair of complementary transistors are connected together to an output terminal and an inductive load is connected to the output terminal to form a complementary push-pull amplifier of the emitter-grounded type. That is, the emitter of a PNP-type transistor $Q_{3a}$ is connected to a power supply source terminal $+B_1$ and the collector thereof is connected to an output terminal $t_2$. Further, the collector of an NPN-type transistor $Q_{3b}$ is connected to the output terminal $t_2$ and the emitter thereof is connected to a power supply source terminal $-B_1$. Between the emitter-collector of each of the transitsitors $Q_{3a}$ and $Q_{3b}$, there are connected diodes $D_{5a}$ and $D_{5b}$ in the direction inverse to the direction of the main currents of the transistors $Q_{3a}$ and $Q_{3b}$, respectively. The output terminal $t_2$ is grounded through an inductive load $L_i$. A PNP-type transistor $Q_{2a}$, which will serve as a switching element, is connected between the base-emitter of the transistor $Q_{3a}$ through a diode $D_{3a}$, and an NPN-type transistor $Q_{2b}$, which will serve also a switching element, is connected between the base-emitter of the transistor $Q_{3b}$ through a diode $D_{3b}$, respectively. Further, there are provided NPN-type and PNP-type transistors $Q_{1a}$ and $Q_{1b}$ whose bases are connected together to an input terminal $t_1$ which is supplied with a pulse signal such as a pulse width modulated signal and so on. The transistors $Q_{1a}$ and $Q_{1b}$ are grounded at their commonly connected emitters through a resistor $R_1$ and at their collectors to the power supply terminals $+B_1$ and $-B_1$ through load resistors $R_{2a}$ and $R_{2b}$, respectively, and also to the bases of the transistors $Q_{2a}$ and $Q_{2b}$ through diodes $D_{1a}$ and $D_{1b}$, respectively, to make the latter ON and OFF alternately. The collectors of the transistors $Q_{2a}$ and $Q_{2b}$ are connected to power supply terminals $+B_2$ and $-B_2$ through load resistors $R_{3a}$ and $R_{3b}$, respectively. Further, diodes $D_{2a}$, $D_{2b}$, $D_{4a}$ and $D_{4b}$ are connected between the base and collector of each of the transistors $Q_{2a}$, $Q_{2b}$, $Q_{3a}$ and $Q_{3b}$, respectively. The diodes $D_{1a}$, $D_{2a}$, $D_{1b}$, $D_{2b}$, $D_{3a}$, $D_{4a}$, $D_{3b}$ and $D_{4b}$ serve to prevent the collector potentials of the respective transistors $Q_{2a}$, $Q_{2b}$, $Q_{3a}$ and $Q_{3b}$ from being lower than their base potentials (or to prevent the saturation).

In the above prior art pulse signal amplifier, since there are provided the circuit elements such as especially the diodes $D_{3a}$, $D_{4a}$, $D_{3b}$, $D_{4b}$, the resistors $R_{3a}$, $R_{3b}$, the power supply terminals $+B_2$, $-B_2$ and so on, the amplifier becomes complicated in circuit construction and there easily flows a cascade current due to the storage carrier effect of the output transistors $Q_{3a}$ and $Q_{3b}$.

Figure 2:
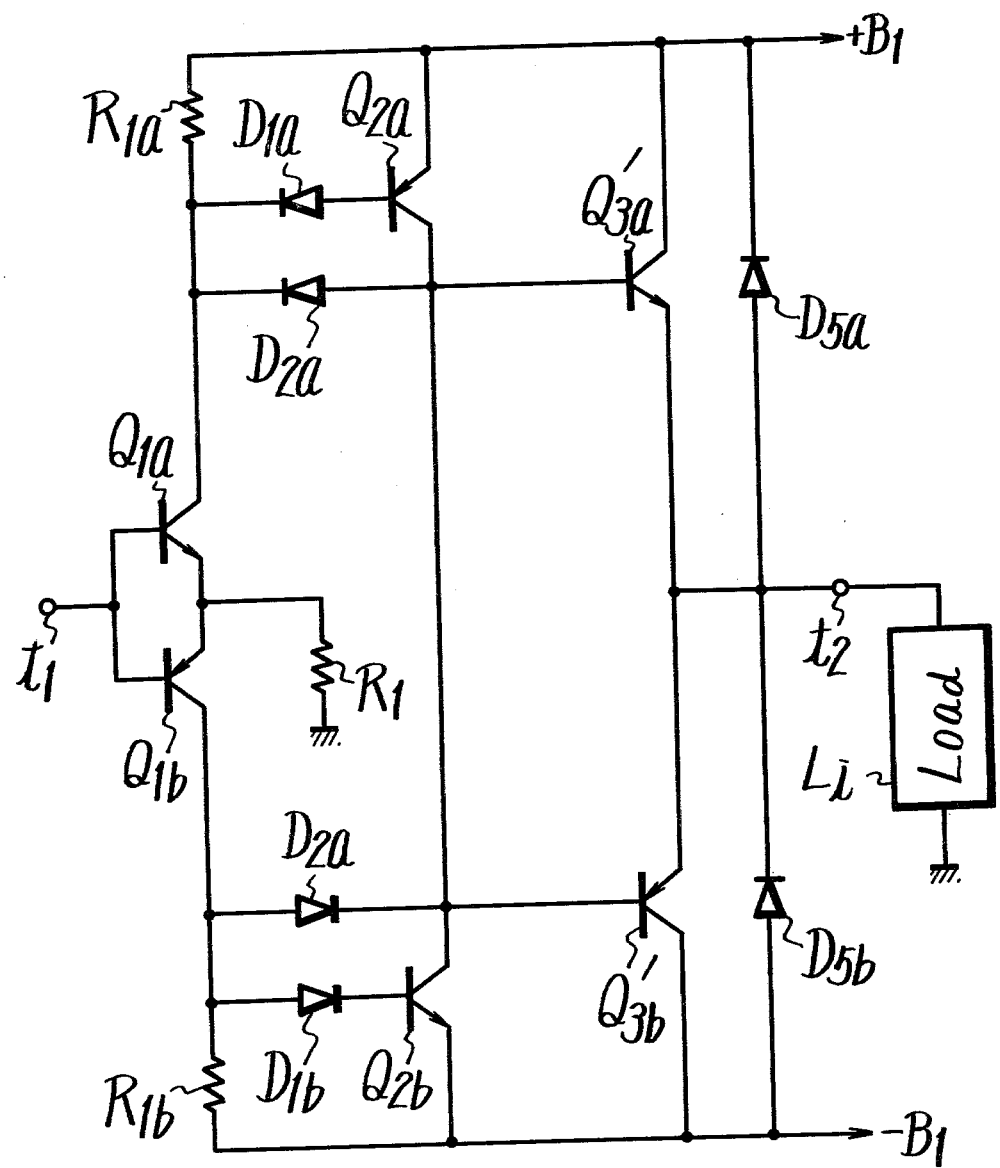

In order to avoid the above defect, there is considered, as shown in FIG. 2, an emitter-follower type complementary push-pull pulse signal amplifier by simplifying the emitter-grounded type complementary push-pull pulse signal amplifier shown in FIG. 1. In FIG. 2, the parts or elements corresponding to those used in FIG. 1 are marked with the same reference numerals and letters.

In the prior art pulse signal amplifier shown in FIG. 2, the emitters of an NPN-type output transistor $Q'_{3a}$ and a PNP-type output transistor $Q'_{3b}$ are connected together to the output terminal $t_2$ which is in turn grounded through the inductive load $L_i$. The bases of the transistors $Q'_{3a}$ and $Q'_{3b}$ are directly connected to the collectors of the transistors $Q_{2a}$ and $Q_{2b}$, respectively, and also directly connected together.

Since the diodes $D_{3a}$, $D_{4a}$, $D_{3b}$, $D_{4b}$, resistors $R_{3a}$, $R_{3b}$ and power supply terminals $+B_2$, $-B_2$ used in the emitter-grounded type complementary push-pull pulse signal amplifier shown in FIG. 1 are not used in the emitter-follower type complementary push-pull pulse signal amplifier shown in FIG. 2, the latter is simple in circuit construction as compared with the former. However, the amplifier shown in FIG. 2 will cause the following defect.

Figure 3A:
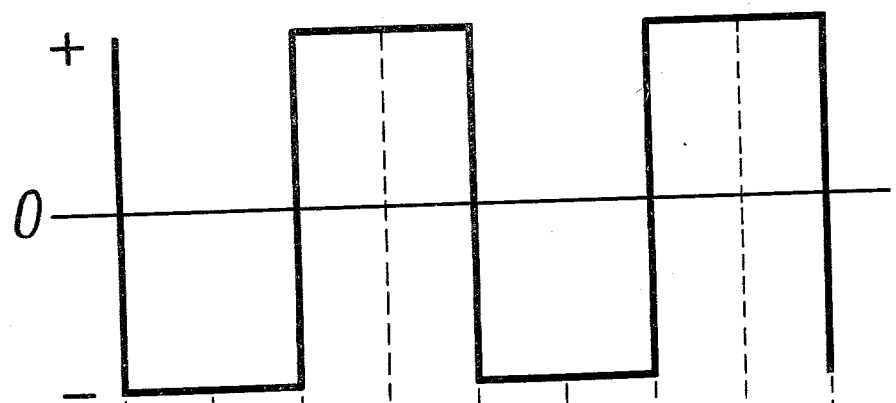
FIGS. 3A and 3B are waveform diagrams used for explaining an operation of the example of the pulse signal amplifier shown in FIG. 2.
Figure 3B:
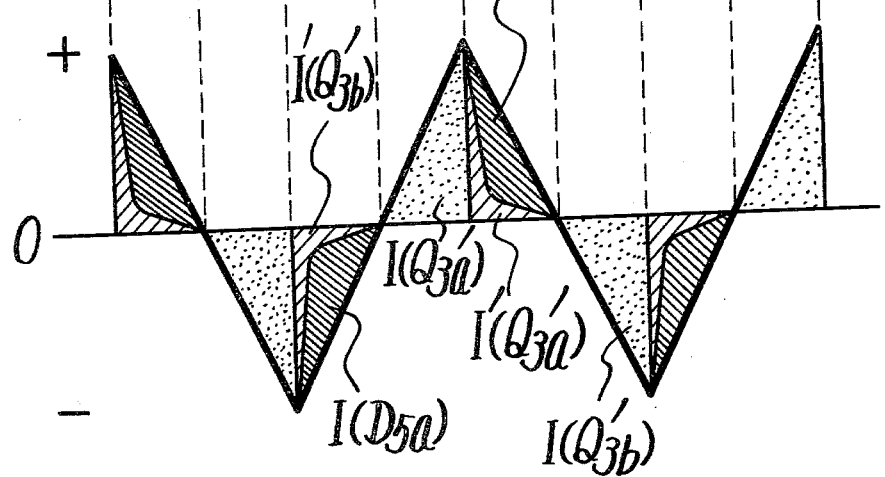

That is, due to the fact that the transistors $Q_{2a}$ and $Q_{2b}$ are made ON and OFF alternately by the pulse width modulated signal fed to the input terminal $t_1$, at the output terminal $t_2$ there is obtained a pulse voltage i.e. rectangular voltage shown in FIG. 3A. Since the voltage shown in FIG. 3A is applied to the inductive load $L_i$, a current having the triangular waveform shown in FIG. 3B flows through the load $L_i$. From the instant that the voltage at the output terminal $t_2$ rises up from the negative to the positive, a current based upon the energy stored in the load $L_i$ flows mainly to the diode $D_{5a}$. Since through the diode $D_{5a}$ there flows not so much large current during the initial portion of the current in the voltage-current characteristic of the diode $D_{5a}$ where the inclination or gradient of the rising-up current is not so sharp and the carrier frequency of the pulse width modulated signal is high such as several hundreds KHz, the diode $D_{5a}$ becomes inductive and hence it becomes more hard that the current flows through the diode $D_{5a}$ during the initial period. Due to this fact, during the initial period the current based upon the energy stored in the load $L_i$ flows to the collector of the transistor $Q_{2a}$ through the emitter-base path of the transistor $Q'_{3b}$ (this current is shown as $I(Q'_{3b})$ in FIG. 3B). As a result, the transistor $Q'_{3b}$, which is required to be non-conductive at this time, becomes conductive. Thus, a voltage, which is the sum of the absolute values of the voltages at the power supply terminals $+B_1$ and $-B_1$, is applied between the collector and emitter of the transistor $Q'_{3b}$ and a great power is uselessly consumed by the transistor $Q'_{3b}$. After a certain time period from the time when the voltage at the output terminal $t_2$ rises up from the negative to the positive, the voltage applied to the diode $D_{5a}$ increases gradually and the current based upon the stored energy in the load $L_i$ flows mainly through the diode $D_{5a}$ (this current is shown by $I(D_{5a})$ in FIG. 3B). After the current due to the stored energy in the load $L_i$ has finished, a current from the power supply terminal $+B_1$ flows through the collector-emitter path of the transistor $Q'_{3a}$ to the load $L_i$ (this current is shown by $I(Q'_{3a})$ in FIG. 3B).

When the transistor $Q_{2b}$ turns ON in the following negative cycle, the voltage at the output terminal $t_2$ lowers from the positive to the negative. At that instant, during the initial period the current based upon the energy stored in the load $L_i$ flows through the base-emitter path of the transistor $Q'_{3a}$ from the collector side of the transistor $Q_{2b}$ (this current is shown by $I'(Q'_{3a})$ in FIG. 3B). As a result, the transistor $Q'_{3a}$, which must be non-conductive, becomes conductive and a voltage, which is the sum of the absolute values of the voltages at the power supply terminals $+B_1$ and $-B_1$, is applied between the collector and emitter of the transistor $Q'_{3a}$. Thus, a great power is uselessly consumed by the transistor $Q'_{3a}$. After a certain time period from the time when the voltage at the output terminal $t_2$ falls down from the positive to the negative, the voltage applied to the diode $D_{5b}$ increases gradually, and the current based upon the energy stored in the load $L_i$ flows mainly through the diode $D_{5b}$ (this current is shown by $I(D_{5b})$ in FIG. 3B). After the current due to the stored energy in the load $L_i$ has finished, a current from the power supply terminal $+B_1$ flows through the emitter-collector path of the transistor $Q'_{3b}$ to the load $L_i$ (this current is shown by $I(Q'_{3b})$ in FIG. 3B).

As described above, in the emitter-follower type complementary push-pull pulse signal amplifier shown in FIG. 2, during the respective positive and negative cycles of the pulse width modulated voltage appearing at the output terminal $t_2$, the current based upon the energy stored in the load $L_i$ flows not only to the diodes $D_{5a}$ and $D_{5b}$ but also to the transistors $Q'_{3b}$ and $Q'_{3a}$. Thus, the power is uselessly consumed in the pulse signal amplifier shown in FIG. 2.

An example of the pulse signal amplifier according to the present invention, which is free from the defects of the prior art, will be described with reference to FIG. 4, in which the elements corresponding to those of FIGS. 1 and 2 are maked with the same reference numerals and letters and their detailed description will be omitted for the sake of brevity.

Figure 4:
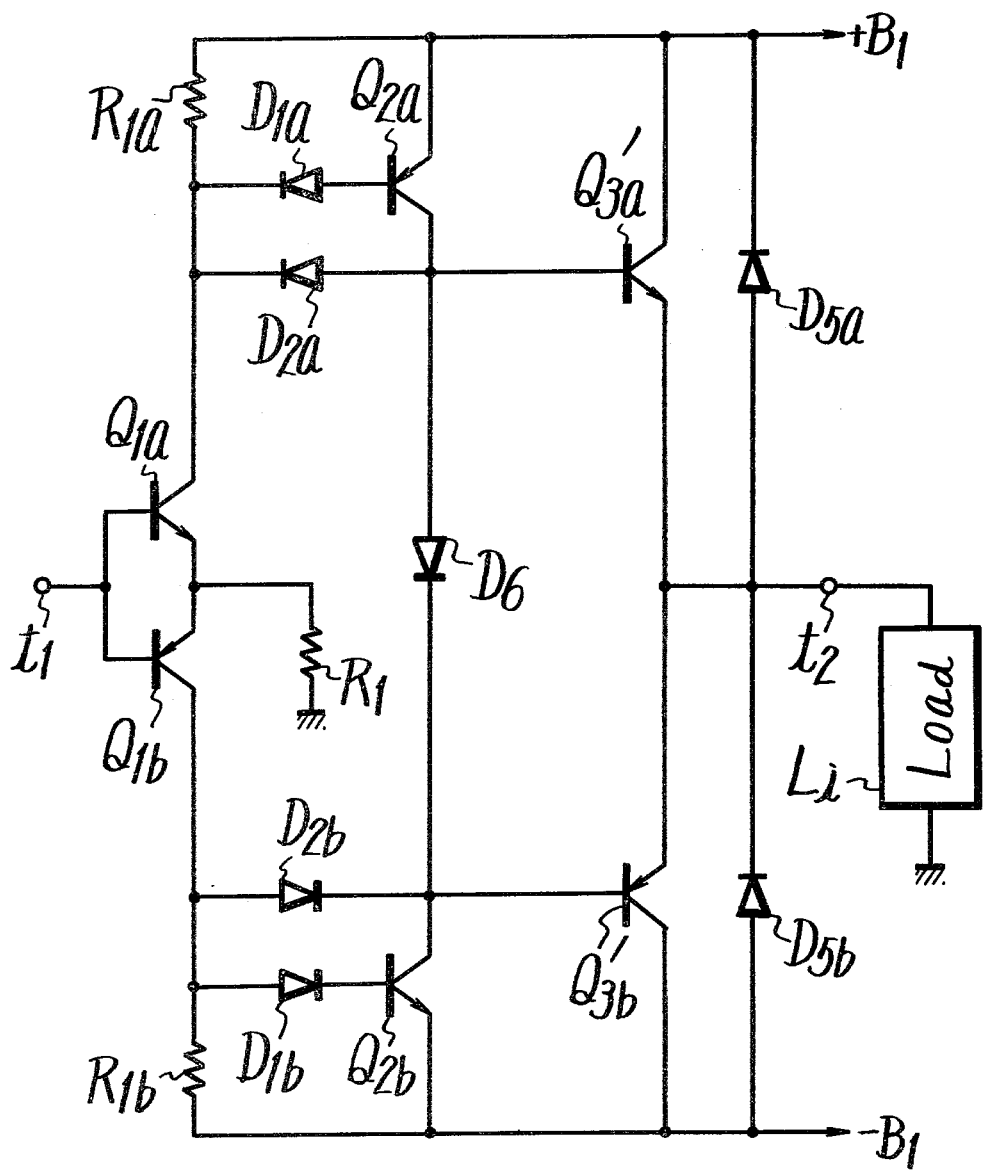
FIG. 4 is a circuit diagram showing an example of the pulse signal amplifier according to the present invention.

In the example of the invention shown in FIG. 4, a diode $D_6$ is connected between the bases of the transistors $Q'_{3a}$ and $Q'_{3b}$ in the direction same as the base-emitter of each of the transistors $Q'_{3a}$ and $Q'_{3b}$. In detail, the diode $D_6$ is connected at the anode thereof to the base of the NPN-type transistor $Q'_{3a}$ and at the cathode thereof to the base of the PNP-type transistor $Q'_{3b}$. The other circuit construction of the example shown in FIG. 4 is substantially same as that of FIG. 2.

With the pulse signal amplifier of the invention shown in FIG. 4, immediately after the time when the pulse width modulated voltage appearing at the output terminal $t_2$ changes from the negative or positive to the positive or negative as described in connection with the pulse signal amplifier of FIG. 2, if the current based upon the energy stored in the load $L_i$ intends to flow through the emitter-base path of the transistor $Q'_{3b}$ to the collector side of the transistor $Q_{2a}$ or to flow from the collector of the transistor $Q_{2b}$ to the base-emitter path of the transistor $Q'_{3a}$, any of the currents is prevented by the diode $D_6$. Accordingly, in the example of the invention shown in FIG. 4 almost all of the current based upon the energy stored in the load $L_i$ flows through the diode $D_{5a}$ or $D_{5b}$ and hence the useless power consumption occurred in the prior art is avoided by this example of the invention.

In the above example of the invention, one stage of the output transistor is used but it is possible that two transistors connected in Darlington can be used in place of one stage of the output transistor.

Figure 5:
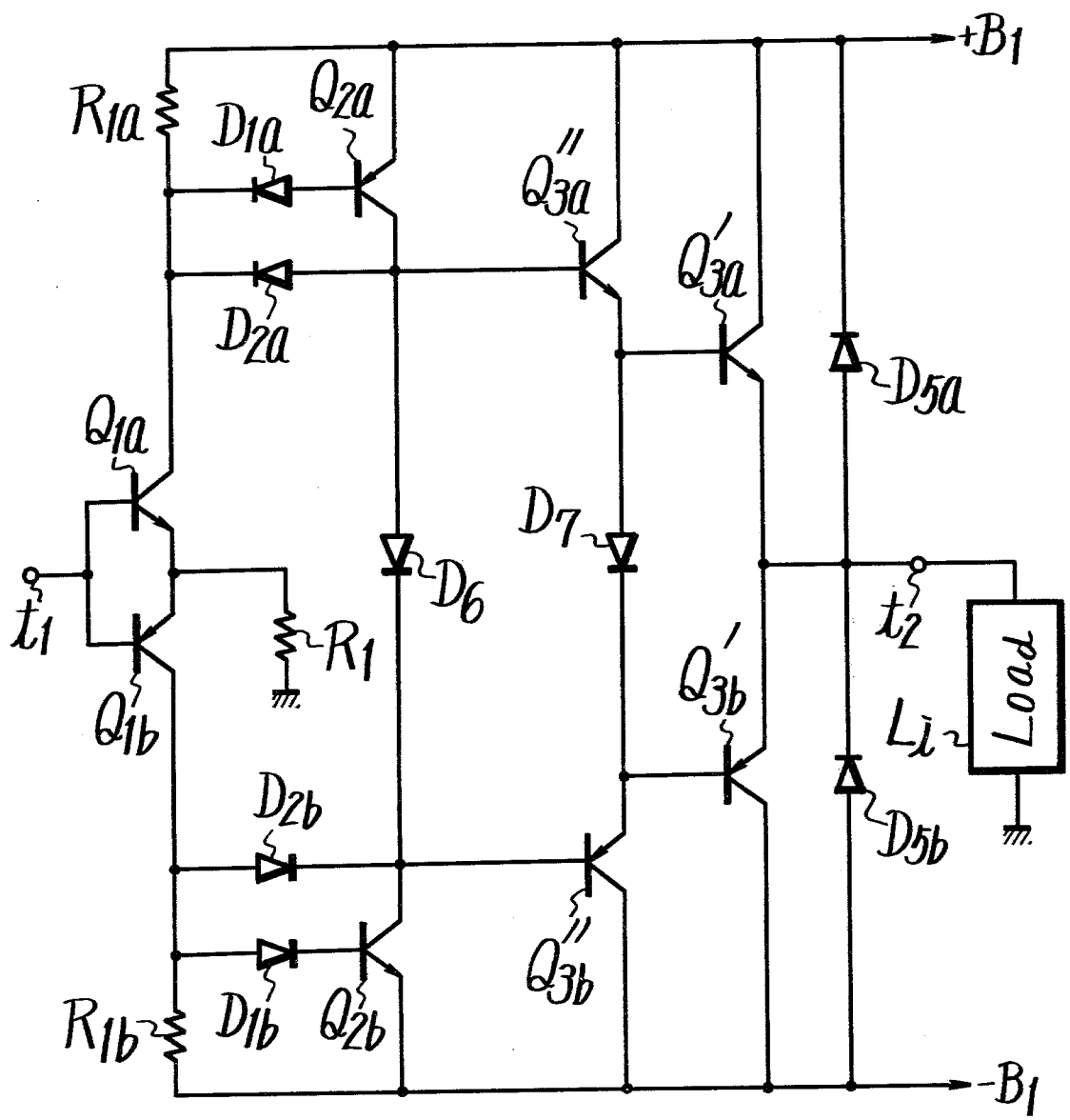
FIG. 5 is a circuit diagram showing another example of the invention.

Turning to FIG. 5 another example of the present invention will be described in which the elements same as those of FIG. 4 are marked with the same reference numerals and letters. In this example, another NPN-type transistor $Q''_{3a}$ is connected to the NPN-type output transistor $Q'_{3a}$ in Darlington and another PNP-type transistor $Q''_{3b}$ is connected to the PNP-type output transistor $Q'_{3b}$ in Darlington, respectively. That is, the emitter of the transistor $Q''_{3a}$ is connected to the base of the transistor $Q'_{3a}$, the emitter of the latter is connected to the output terminal $t_2$, and the emitter of the transistor $Q''_{3b}$ is connected to the base of the transistor $Q'_{3b}$ whose emitter is connected to the output terminal $t_2$. In this case, in addition to the diode $D_6$ connected between the bases of the transistors $Q''_{3a}$ and $Q''_{3b}$, another diode $D_7$ is connected between the bases of the transistors $Q'_{3a}$ and $Q'_{3b}$. That is, the diode $D_7$ is connected at the anode thereof to the base of the transistor $Q'_{3a}$ and at the cathode thereof to the base of the transistor $Q'_{3b}$.

According to the above pulse signal amplifiers of the present invention, even though it is the emitter-follower type complementary push-pull pulse signal amplifier, no power is consumed uselessly, and due to the feature of the emitter-follower type complementary push-pull pulse signal amplifier, it is simple in circuit construction as compared with the emitter-grounded type complementary push-pull pulse signal amplifier.

It will be apparent that many modifications and variations could be effected by one skilled in the art without departing from the spirits or scope of the novel concepts of the present invention, so that the spirits or scope of the invention should be determined by the appended claims only.

I claim as my invention

1. A pulse signal amplifier comprising:
  (a) DC voltage source means having a pair of first and second terminals;
  (b) pulse signal source means for supplying a pulse signal to be amplified;
  (c) pre-drive means including a pair of complementary first and second drive transistors each having control, first and second output electrodes, the control electrodes of which are supplied with the pulse signal from said pulse signal source means, the first output electrodes of which are connected to each other and to a reference point, and the second output electrodes of which are connected to the first and second terminals of said DC voltage source means through first and second loads, respectively;
  (d) drive means including a pair of complementary third and fourth drive transistors each having control, first and second output electrodes, the control electrodes of which are connected to the second output electrodes of said first and second drive transistors and the first output electrodes of which are connected to the first and second terminals of said DC voltage source means, respectively;
  (e) output stage means including a pair of complementary first and second transistors each having base, emitter and collector electrodes, the base electrodes of which are connected to the second output electrodes of said third and fourth drive transistors, respectively, and collector and emitter circuits of which are connected in series between the first and second terminals of said DC voltage source means, and the connection point of which is connected to an output terminal to which an inductive load is connected;
  (f) first and second diode means connected between the collector and emitter electrodes of said first and second output transistors, respectively, through the first diode means of which flows a first bypass current from said inductive load during the first quarter-period of the pulse signal from said pulse signal source means and through the second diode means of which flows a second bypass current from said inductive load during the third quarter-period of said pulse signal source means; and
  (g) current limiting means connected between the second output electrodes of said third and fourth drive transistors such that said first and second bypass currents are prevented from flowing through the base-emitter circuit of said second and first output transistors, respectively, into the second output electrodes of said third and fourth drive transistors.

2. A pulse signal amplifier according to claim 1, in which said current limiting means comprises a diode having anode and cathode electrodes, the anode electrode of which is connected to the second output electrode of said third drive transistor and the cathode electrode of which is connected to the second output electrode of said fourth drive transistor.

3. A pulse signal amplifier according to claim 2, in which each of said first and second output transistors is connected in a common emitter circuit.

4. A pulse signal amplifier according to claim 3, in which each of said first and second drive transistors is connected in a common emitter circuit.

5. A pulse signal amplifier according to claim 4, in which each of said third and fourth drive transistors is connected in a common emitter circuit.

6. A pulse signal amplifier according to claim 5, in which each polarity of said first and fourth drive transistors and first output transistor is of an NPN-type and each polarity of said second and third drive transistors and said second output transistor is of a PNP-type.

7. A pulse signal amplifier according to claim 1, further including an impedance transfer circuit consisting of at least fifth and sixth drive transistors each having base, emitter and collector electrodes, the base electrodes of which are connected to the second output electrodes of said third and fourth drive transistors, respectively, the emitter electrodes of which are connected to the base electrodes of said first and second output transistors, respectively, and the collector electrodes of which are connected to the first and second terminals of said DC voltage source means, respectively 8. A pulse signal amplifier according to claim 7, further includes third and fourth diode means so as not to drive said third and fourth drive transistors into saturation regions, respectively.

9. A pulse signal amplifier according to claim 8, in which said third diodes means comprises a pair of diodes connected between the second output electrode of said first drive transistor and the control, and second output electrodes of said third drive transistor, respectively.

10. A pulse signal amplifier according to claim 9, in which said fourth diode means comprises a pair of diodes connected between the second output electrode of said second drive transistor and the control and second output electrodes of said fourth drive transistor, respectively.

* * * * *